United States Patent
Parmon

(10) Patent No.: US 9,589,908 B1
(45) Date of Patent: Mar. 7, 2017

(54) METHODS TO IMPROVE BGA PACKAGE ISOLATION IN RADIO FREQUENCY AND MILLIMETER WAVE PRODUCTS

(71) Applicant: Freescale Semiconductor, Inc., Austin, TX (US)

(72) Inventor: Walter Parmon, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/869,287

(22) Filed: Sep. 29, 2015

(51) Int. Cl.
  *H01P 5/02* (2006.01)
  *H01L 23/552* (2006.01)
  *H01L 23/498* (2006.01)
  *H01L 23/66* (2006.01)
  *H01L 21/48* (2006.01)

(52) U.S. Cl.
  CPC ......... *H01L 23/552* (2013.01); *H01L 21/486* (2013.01); *H01L 21/4853* (2013.01); *H01L 23/49816* (2013.01); *H01L 23/49827* (2013.01); *H01L 23/66* (2013.01); *H01L 2223/6683* (2013.01)

(58) Field of Classification Search
  CPC ........... H01L 23/552; H01L 2924/3025; H01L 23/66; H01L 23/49827; H01L 2924/1421; H01L 2924/19105; H01L 23/5226; H01L 23/5227; H01L 23/645
  See application file for complete search history.

(56) References Cited

U.S. PATENT DOCUMENTS

| | | | |
|---|---|---|---|
| 7,869,225 B2 | 1/2011 | Tang et al. | |
| 9,337,137 B1 * | 5/2016 | Mills | H01L 23/552 |
| 2006/0226928 A1 * | 10/2006 | Henning | H05K 1/0222 |
| | | | 333/33 |
| 2014/0253258 A1 | 9/2014 | Parmon | |

OTHER PUBLICATIONS

Freescale Semiconductor, Inc., Ceramic Ball Grid Array Packaging, Assembly & Reliability, last modified Aug. 16, 2006, publication date unknown http://www.freescale.com/files/32bit/doc/package_info/CBGAPRES.pdf.

* cited by examiner

*Primary Examiner* — Roy Potter

(57) ABSTRACT

A method and apparatus are provided for manufacturing a packaged electronic device (200) which includes a carrier substrate (120) in which conductive interconnect paths (122) extend between first and second opposed surfaces, an integrated circuit die (125) affixed to the first surface of the carrier substrate for electrical connection to the plurality of conductive interconnect paths, and an array of conductors (110), such as BGA, LGA, PGA, C4 bump or flip chip conductors, affixed to the second surface of the carrier substrate for electrical connection to the plurality of conductive interconnect paths, where the array comprising a signal feed ball (112) and an array of shielding ground balls (111) surrounding the signal feed ball.

20 Claims, 6 Drawing Sheets

US 9,589,908 B1

METHODS TO IMPROVE BGA PACKAGE ISOLATION IN RADIO FREQUENCY AND MILLIMETER WAVE PRODUCTS

BACKGROUND OF THE INVENTION

Field of the Invention

The invention relates generally to the field of integrated circuit (IC) device packaging technology. In one aspect, the present invention relates to ball grid array (BGA) packages for RF and millimeter wave (mmW) integrated circuit having improved isolation performance.

Description of the Related Art

As the density and complexity of integrated circuit devices increases and the size of such devices shrinks, significant challenges are posed in the design and packaging of these devices. One challenge is that more and more power and signal lines must be electrically connected to the integrated circuit die as the circuit complexity increases, though there is less and less space to allow for such connection as the device sizes shrink. Another challenge is that the conventional approaches for packaging the integrated circuit devices—such as the ball grid array (BGA), the land grid array (LGA), and the pin grid array (PGA) packages—can lead to electromagnetic signal interference between signal lines (e.g., for transmit and receive channels), especially as the spacing decreases between signal lines at the external package substrate surface of RF and millimeter wave (mmW) devices. As a result, the existing packaging solutions for isolating the channels on packaged integrated circuit devices make the signal line isolation extremely difficult at a practical level.

BRIEF DESCRIPTION OF THE DRAWINGS

The present invention may be understood, and its numerous objects, features and advantages obtained, when the following detailed description is considered in conjunction with the following drawings.

DETAILED DESCRIPTION

A method and apparatus are described for fabricating and/or operating a packaged integrated circuit device by surrounding each signal ball with an encircling array of shielding solder balls to improve BGA package isolation in radio frequency and millimeter wave products. In selected embodiments, each signal ball in a BGA array may be isolated and shielded from other interfering signals in a BGA IC package by positioning each signal ball to be surrounded by an encircling array of shielding solder balls to thereby improve the isolation between RX (receive) channels and/or TX (transmit) channels. Specific structures are disclosed for achieving high isolation performance by confining the electromagnetic (EM) fields in the solder ball (SB) region between the BGA IC package and attached module board. The use of the disclosed isolation structures to confine the electromagnetic fields in the solder ball region may also reduce insertion loss from the module board to the IC die circuit by controlling the propagation of the mmW in a desired direction and simultaneously minimizing the propagation of the mmW signals in unwanted directions. In selected embodiments, each non-peripheral signal solder ball of a BGA package is completely surrounded with eight ground solder balls formed as a 3×3 ball sub-array of solder balls that are located around the non-peripheral signal solder ball to provide a complete surrounding shield around the signal solder ball. When attached to a module board, the signal supplied to the non-peripheral signal solder ball may be routed to a transmission line on the back of the module board and/or re-routed to a transmission line on the top of the module board, with the routing selected to avoid signal interference with other signal lines.

Figure 1:
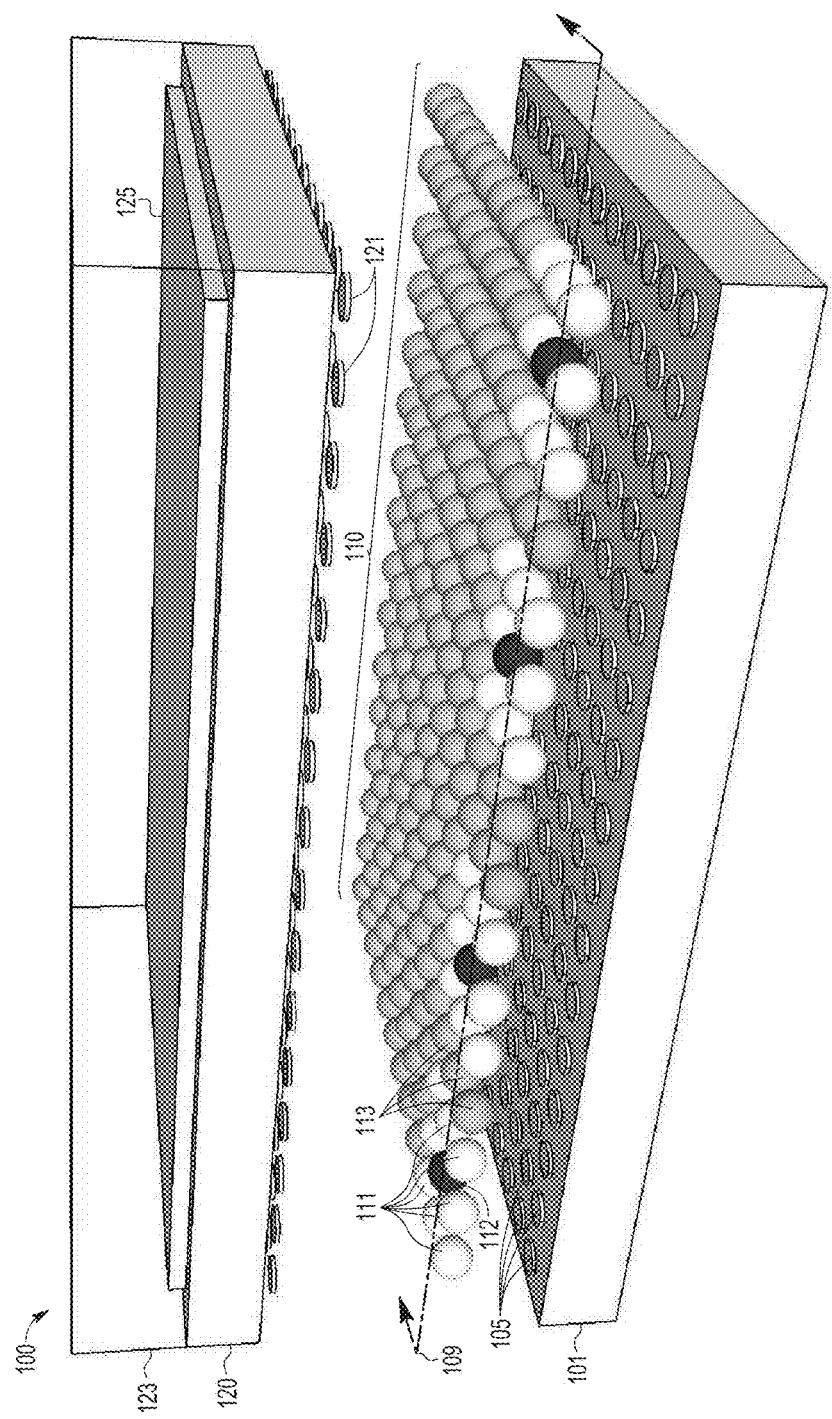
FIG. 1 illustrates an exploded perspective view of an integrated circuit (IC) die and carrier substrate positioned for connection across a ball grid array (BGA) to a module board in accordance with selected embodiments of the present disclosure.

Referring now to FIG. 1, there is shown an exploded perspective view 100 of an integrated circuit die 125 mounted on a carrier substrate panel 120 that is positioned for connection across a conductor array 110—such as a ball grid array (BGA), land grid array (LGA), pin grid array (PGA), C4 bump or flip chip packages—to a module board 101. Though not shown, it will be appreciated that the integrated circuit die 125, BGA 110, and module board 101 may each be formed as part of an aligned matrix array of integrated circuit die mounted on a carrier substrate 120 for encapsulation molding. As illustrated, each of integrated circuit die 125 is encapsulated on the carrier substrate panel 120 by the mold compound package 123. Though not explicitly shown, it will be appreciated that each die 125 is electrically connected to conductors in the carrier substrate panel 120 using an appropriate substrate-to-die interconnect mechanism, such as flip chip bonding. In addition, a patterned array of conductor pads 121 may be formed on a second lower surface of the carrier substrate panel 120 for connection across the conductors in the carrier substrate panel 120 to the integrated circuit die 125. In alignment with the patterned array of conductor pads 121, a patterned array of conductor pads 105 is formed on a first upper surface of the module or test board 101 so that the ball grid array 110 may be positioned in registry with the patterned array of conductor pads 121, 105 for connecting the carrier substrate panel 120 to the module/test board 101.

Figure 2:
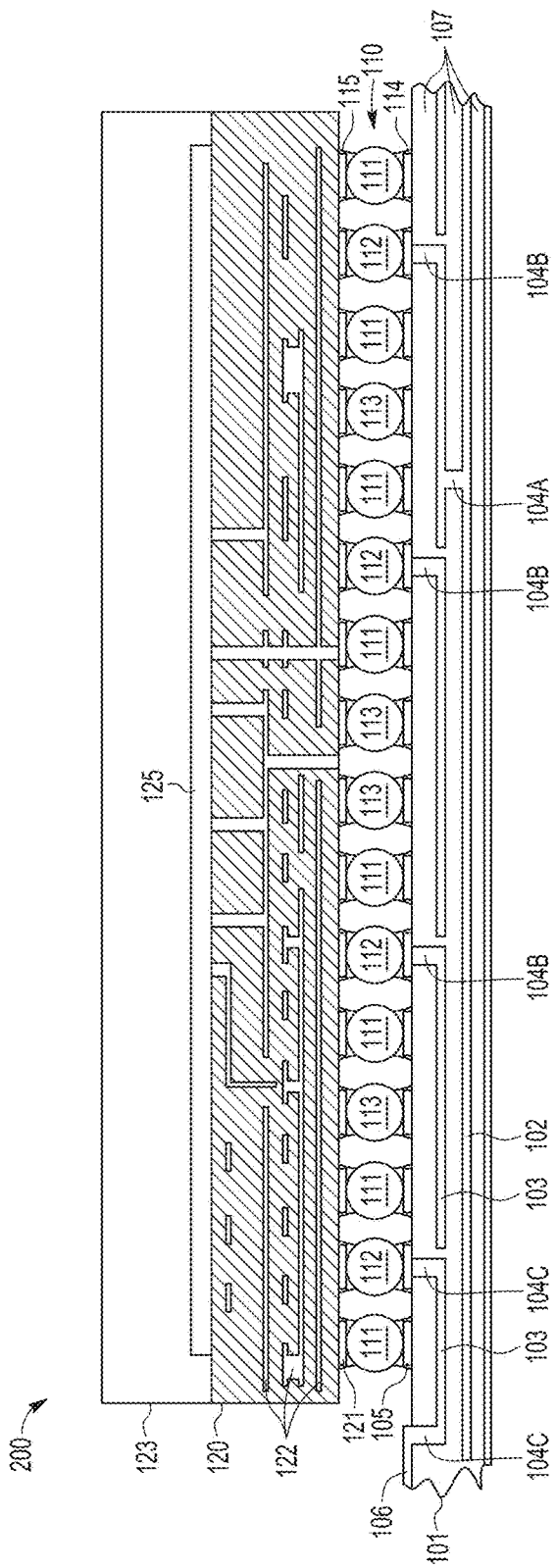
FIG. 2 illustrates a cross-section view of a BGA IC package after the IC die and carrier substrate panel are attached to the ball grid array and module board of FIG. 1.

To provide additional details for an improved understanding of selected embodiments of the present disclosure, reference is now made to FIG. 2 which depicts a cross-section view 200 of a BGA IC package from the vantage 109 indicated in FIG. 1 after the IC die 125 and carrier substrate panel 120 are attached via the ball grid array 110 to a module board 101 or to another interconnect structure between stacked packages. The depicted module board 101 may be implemented as a circuitized substrate carrier 102-107 (e.g., a printed circuit board) which includes a multilayer interconnect structure 102-106 with metallization lines 102-103, 106, plated through hole conductors 104A-C, and contact pads 105 for electronically interconnecting the integrated circuit die 125 to/from external circuits (not shown). In selected embodiments, the module board 101 may be formed as a multilayer interconnect structure 102-107 having alternating layers of dielectric 107 and conductive materials 102-106 to define the circuit elements and traces. As will be appreciated, any desired circuitized substrate carrier 101 may be used, such as a conventional printed wiring board substrate having layers of glass reinforced epoxy laminate 107 to encapsulate various layers of circuitry formed with circuit elements and traces 102-106. The various layers of conductors or circuitry in the circuitized substrate carrier 101 are electrically interconnected to one another and to the integrated circuit die 125 by the plated through hole vias or conductors 104A-C which may be formed by drilling holes (e.g., with a laser drill) that intersect the circuit features that are to be connected and then plating the walls of the holes with conductive plating layers 104A-C to form electrical connections. In the course of forming the module board 101, conductive plating layers 102-103 are formed in the dielectric layers 107 along with patterned contact pads 105 and transmission lines 106 on the top surface of the carrier 101. The exterior surface metal used to form the contact pads 105 may be patterned to provide lands surrounding the plated through holes 104B-C which are larger than the diameters of the holes.

The depicted BGA IC package 200 also includes at least a first integrated circuit die 125 that is attached to the carrier substrate panel 120 using flip chip bumps or other appropriate die attach method. The IC die 125 may be any type of integrated circuit device, such as a microprocessor, digital signal processor (DSPs), or an analog device, memory, or circuits that perform any other type of function. For example, the IC die 125 may be a Radio frequency (RF) device, analog mixed-signal (AMS) device, high-frequency (e.g., >60 GHz) millimeter-wave (mmW) device, or the like. Thus, the IC die 125 is not limited to a particular technology (such as CMOS) or derived from any particular wafer technology. The IC die 125 may also be electrically connected to conductors in the carrier substrate panel 120 via a plurality of conductors, such as flip-chip bump conductors formed between the IC die 125 and contact pads on the carrier substrate panel 120. Though not depicted, the flip-chip bump conductors may be formed in rows and columns for making electrical contact between the carrier substrate panel 120 and IC die 125. Though depicted with reference to the BGA IC package 200 being connected to a module board 101, it will be appreciated that the disclosure herein may be applied for any desired package to package connection, die to die connection, board to board connection, or any possible cross combination with similar such structures. In any such embodiment, the use of an array of shielding solder balls or conductors to substantially surround or encircle the signal feed solder ball or conductor will increase the isolation and decrease the insertion loss which refers generally to the loss of signal power resulting from the insertion of a device in a transmission line or optical fiber and is usually expressed in decibels (dB).

In the depicted carrier substrate panel 120, conductors 122 are formed between the flip-chip bump conductors and the patterned array of conductor pads 121 to provide a conductive path for signals and voltages. In selected example embodiments, the carrier substrate panel 120 may be formed with a plurality of stacked insulating layers in which the conductors 122 are formed as metallization layers, such as patterned signal trace lines and conductive via structures. The insulating layers may be formed with any suitable dielectric material, such as for example, a ceramic, a silicon oxide, or tetraethyl orthosilicate (TeOS). As used herein, an insulating layer can be any layer that insulates a conductor from a laterally adjacent conductor in the carrier substrate panel 120, and can refer to a void in an otherwise conductive layer. In the course of forming the insulating layers, the conductors 122 may be formed by depositing one or more conductive layers which are patterned and selectively etched to form the patterned signal trace lines and conductive via structures 122 that provide one or more signal and/or reference voltage conduits between the integrated circuit die 125 and the patterned array of conductor pads 121.

To connect the carrier substrate panel 120 and module board 101, a plurality of ball grid array conductors 110 are aligned and attached to the patterned array of conductor pads 121 on the carrier substrate panel 120 and to the patterned array of conductor pads 105 on the module/test board 101. While any desired BGA attachment process may be used, the ball grid array conductors 110 may be formed on the second lower surface of the carrier substrate panel 120 by patterning and etching an insulating layer on the bottom of the carrier substrate panel 120 to form via openings which expose one or more of the conductor layers 122. In the via openings, one or more conductive layers may be formed to provide conductive via structures 122, such as by depositing and patterning a conductive metal, metal alloy, aluminum, copper, tantalum, titanium, tungsten, or any metal alloy, nitride or silicide. Subsequently, a plurality of conductive ball or pillar-shaped connectors 110 may be positioned and attached to the patterned array of conductor pads 105, 121 using standard techniques and materials. To this end, a layer of electrically conductive material 114, 115 (e.g., copper, conductive paste or solder) may be applied to each conductor pad 105, 121, followed by formation and attachment of solder balls or pillar structures (e.g., 111) formed with a conductive material (e.g., copper) between corresponding contact pads (e.g., 105, 121). For example, a pattern of solder connections 115 may be formed on the patterned array of conductor pads 121. In addition, a pattern of solder connections 114 may be formed on the patterned array of conductor pads 105. Finally, a patterned array of BGA conductors 110 may be formed with solder balls or conductive pillar structures 110 to connect the module 101 to the carrier substrate panel 120.

In this way, selected ones of the BGA conductors (e.g., signal solder ball 112) may provide a direct electrical signal path from a plated through hole conductor 104 in the circuitized substrate carrier 101, across a conductor pad 105, solder connection 114, solder ball 112, solder connection 115, conductor pad 121, conductor(s) 122, and flip-chip bump conductors to the IC die 125. Surrounding each signal solder ball 112, selected ones of the BGA conductors (e.g., shielding solder balls 111) may provide a shielding or grounded conductor path from a plated through hole conductor 104 in the circuitized substrate carrier 101, across a conductor pad 105, solder connection 114, solder ball 111, solder connection 115, conductor pad 121, conductor(s) 122, and flip-chip bump conductors to the IC die 125. As indicated with the perspective view of FIG. 1, the signal solder balls 112 are located in a non-peripheral portion of the array 110 so as to be surrounded on every side by shielding solder balls 111, thereby isolating and shielding a desired signal line (e.g., at signal solder ball 112) from interfering signals in BGA IC packages. In selected embodiments, the shielding function may be achieved by positioning each signal solder ball 112 at the center of a 2×2 array of shielding solder balls 111. In other embodiments, the shielding function may be achieved by positioning each signal solder ball 112 at the center of a 3×3 array of shielding solder balls 111.

The placement and arrangement of the interconnect structures 102-106 in the module board 101 may define different routing paths for the signals and voltages applied to the module board 101. For example, when selected conductor pads 105 on top of the module board 101 are used to supply ground voltages to the shielding solder balls 111 surrounding a signal solder ball 112, a signal path to or from the signal solder ball 112 may be re-routed back to a transmission line or pad 106 on the top surface of the carrier 101 by using plated through hole conductors 104C that are connected to a conductive plating layer 103. In addition or in the alternative, a signal path to or from the signal solder ball 112 may be routed to the backside of the carrier 101 by using plated through hole conductors 104A-B that connect the conductive plating layer 102 across plating layer 102 to the signal solder ball 112.

Figure 3:
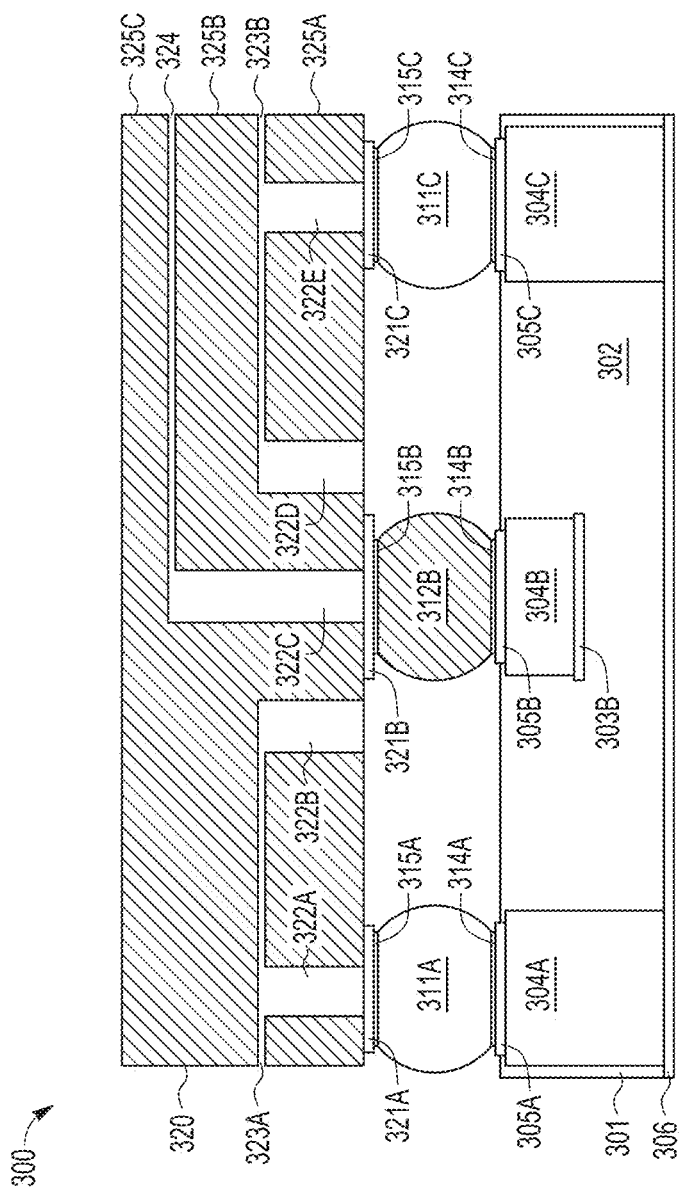
FIG. 3 illustrates an enlarged cross-sectional view of the BGA IC package in which a signal line is completely surrounded by a sub-array of shielding solder balls in accordance with selected embodiments of the present disclosure.

To provide additional details for an improved understanding of selected embodiments of the present disclosure, reference is now made to FIG. 3 which depicts an enlarged cross-sectional view of the BGA IC package 300 in which a signal line solder ball 312B is completely surrounded by a sub-array of shielding solder balls 311A, 311C. The depicted BGA package 300 includes a module board 301 which may be implemented as a multilayer interconnect structure 302-306 having alternating layers of dielectric 302 and conductive structures 303-306. The alternating dielectric layers 302 may be formed with layers of glass reinforced epoxy laminate or other suitable materials. The conductive structures 303-306 may define the circuit elements and traces with deposited and/or patterned metallization lines 303B, plated through hole conductors 304A-C, contact pads 305A-C, and thin metallic layer 306 (e.g., copper) covering the bottom surface of 301 for connection to a reference voltage (e.g., ground). A plurality of ball grid array conductors 311A, 312B, 311C are attached to the contact pads 305A-C using any suitable attachment mechanism, such as by applying a patterned plurality of electrically conductive layers 314A-C (e.g., copper, conductive paste or solder) to each conductor pad 305A-C and then attaching and electrically connecting a corresponding solder ball 311A, 312B, 311C thereto. The ball grid array conductors 311A, 312B, 311C are also attached to contact pads 321A-C of the carrier substrate 320 using conductive layers 315A-C or any other suitable attachment mechanism. The shading of the solder balls 311A, 312B, 311C is provided to indicate that the center solder ball 312B is connected to convey signal information, while the surrounding solder balls 311A, 311C are connected to ground or other suitable reference voltage to confine the electromagnetic fields generated by the center signal solder ball 312B, thereby providing isolation with respect to other signal solder balls.

To account for differing performance requirements as between signal paths (e.g., through center solder ball 312B) and shielding paths (e.g., through surrounding solder balls 311A, 311C), the carrier substrate panel 320 may be formed with specialized interconnect structures to improve isolation and enhance signal transmission through the signal path. To this end, the carrier substrate panel 320 may be formed with a plurality of stacked insulating layers 325A-C in which the conductive trace lines 323, 324 and through hole conductor or via structures 322A-E are formed to promote signal transmission and isolation at the center solder ball 312B. In particular, a first conductive micro-via structure 322A is positioned in the carrier substrate panel 320 to connect a first ball grid array conductor 311A and associated conductive trace line 323A. Similarly, a second conductive micro-via structure 322E is positioned in the carrier substrate panel 320 to connect a second ball grid array conductor 311C and associated conductive trace line 323B. In addition, a third conductive micro-via structure 322C is positioned in the carrier substrate panel 320 to connect a third ball grid array conductor 312B and associated conductive signal trace line 324. By positioning the ball grid array conductors 311A, 311C (and associated micro-via structures 322A, E) to completely surround the center signal solder ball 312B (and associated micro-via structures 322B-D), a ground or other reference voltage applied to the surrounding ball grid array conductors 311A, 311C will help confine the electromagnetic fields generated by the center signal solder ball 312B, as well as prevent electromagnetic fields generated by other signal solder balls from reaching the center signal solder ball 312B.

In selected embodiments, a plurality of additional conductive micro-via or through hole structures 322B, 322D are positioned in the carrier substrate panel 320 as an array (e.g., a 3×3 array) to surround at least part of the third conductive micro-via structure 322C that is directly electrically connected to the signal contact pad 321B and third ball grid array conductor 312B. By connecting the conductive micro-via or through hole structures 322A-B, 322D-E across conductive trace lines 323A, 323B to a reference or ground voltage, improved BGA package isolation is achieved, though it will be appreciated that the conductive micro-via or through hole structures 322A-B, 322D-E may also be connected to ground across one or more contact pad layer conductors (not shown) on the bottom of the carrier substrate panel 320. As formed, the grounded array of additional conductive micro-via or through hole structures 322B, 322D will improve the isolation achieved by the surrounding grounded solder balls 311A, 311C.

Figure 4:
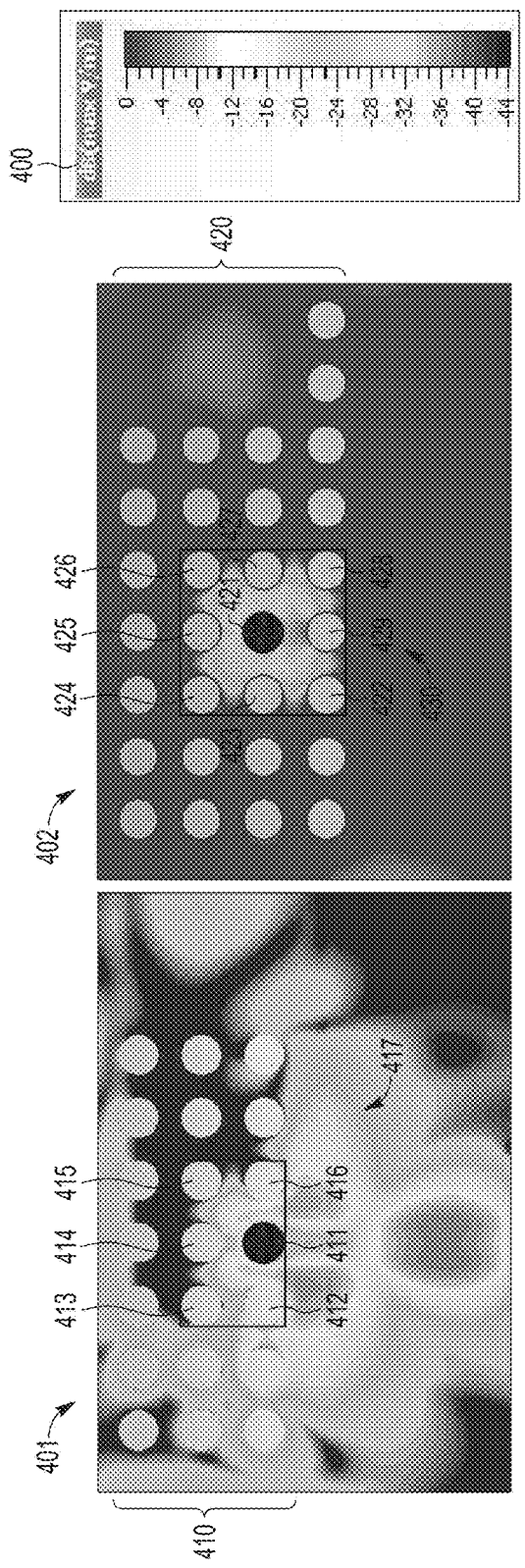
FIG. 4 illustrates in plan view the electromagnetic fields emanating from signal lines that are partially and completely shielded by adjacent solder balls. The fields depicted are on a plane that cuts through the solder ball region.

The resulting electromagnetic field shielding benefits are shown in FIG. 4 which illustrates in plan view the electromagnetic fields emanating from signal lines that are partially and completely shielded by adjacent solder balls. With the first plan view 401, a plurality of ball grid array conductors 410 include a first signal solder ball 411 that is located in a peripheral position in the array 410 so as to be only partially shielded by adjacent solder balls 412-416. Thus positioned, the electromagnetic field 417 generated by the first signal solder ball 411 has a field intensity that can interfere with other signal solder balls. However, the second plan view 402 shows a plurality of ball grid array conductors 420 in which the signal solder ball 421 is located in a non-peripheral position in the array 420 so as to be completely surrounded and shielded by the adjacent shielding solder balls 422-429. While the adjacent shielding solder balls 422-429 are shown as a 3×3 array of solder balls, it will be appreciated that additional or fewer grounded solder balls may be included, so long as the signal solder ball 421 is completely surrounded on all sides. Thus positioned, the electromagnetic field 430 generated by the signal solder ball 421 has a greatly reduced field intensity, resulting in improved isolation between signal solder balls. As indicated with the EM field strength indicator 400, the partially shielded signal solder ball 411 has relatively poor isolation (~−25 dB) in the adjacent region next to the array 410, while the completely shielded signal solder ball 421 has good isolation (<−40 dB) in the adjacent region next to the array 420.

Figure 5:
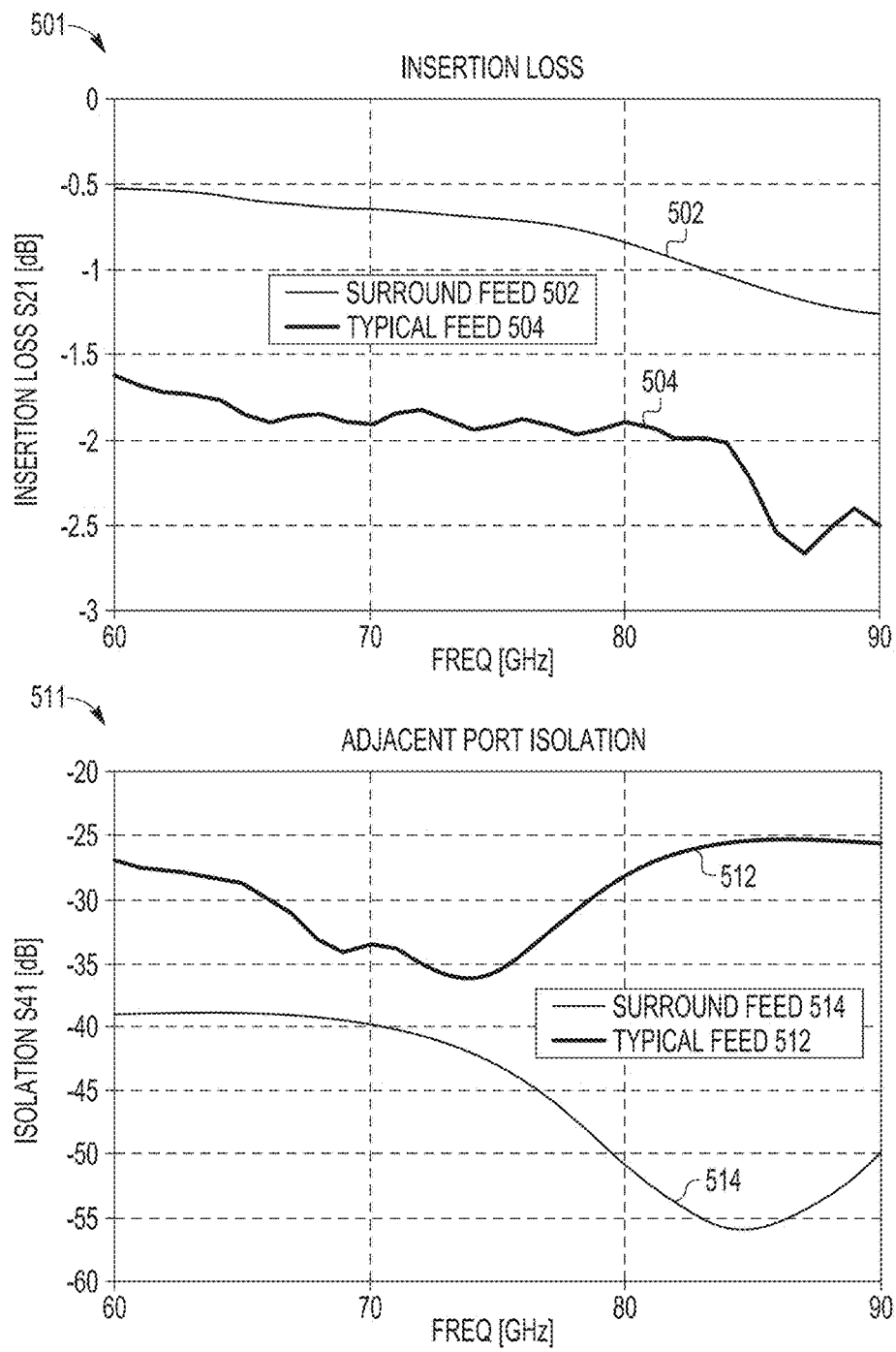
FIG. 5 illustrates a simplified flow chart for fabricating BGA packaged integrated circuit devices in accordance with selected embodiments of the present invention.

To illustrate the improved performance provided by surrounding a signal feed with an encircling array of grounded conductor or solder balls, reference is now made to FIG. 5 which graphically depicts the comparative insertion loss and isolation achieved with a typical, partially shielded signal feed (such as shown in plan view 401) and a fully surrounded and shielded signal feed (such as shown in plan view 402) where both have the ground voltage fed from the bottom of the test board. As illustrated in the insertion loss comparison 501 over the indicated frequency range (60-90 GHz), the insertion loss for a fully surrounded and shielded signal feed 502 is at least 1.0 dB better than the insertion loss for a typical, partially surrounded feed 504, with the insertion loss improvement typically being at least 1.25 dB lower in comparison. In the insertion loss comparison 501, the insertion loss is quantified as negative dB, so a value closer to 0 dB will indicate lower loss.

The fully surrounded and shielded signal feed also has improved signal isolation from nearby transmit or receive channel conductors as compared to the typical signal feed as illustrated with the adjacent port isolation comparison 511 over the indicated frequency range (60-90 GHz). While the quantitative isolation improvement varies over the frequency range, the isolation improvement for the fully surrounded and shielded signal feed 514 is at least 7 dB better, and more typically 12.5-25 dB better, than for the typical, partially surrounded feed 512. In the adjacent channel (port) isolation 511, the isolation improvement is quantified as negative dB, so a more negative value will indicate better isolation. The improved isolation between adjacent ports and lower insertion loss are due to controlling the path of EM path between ports (channels).

Figure 6:
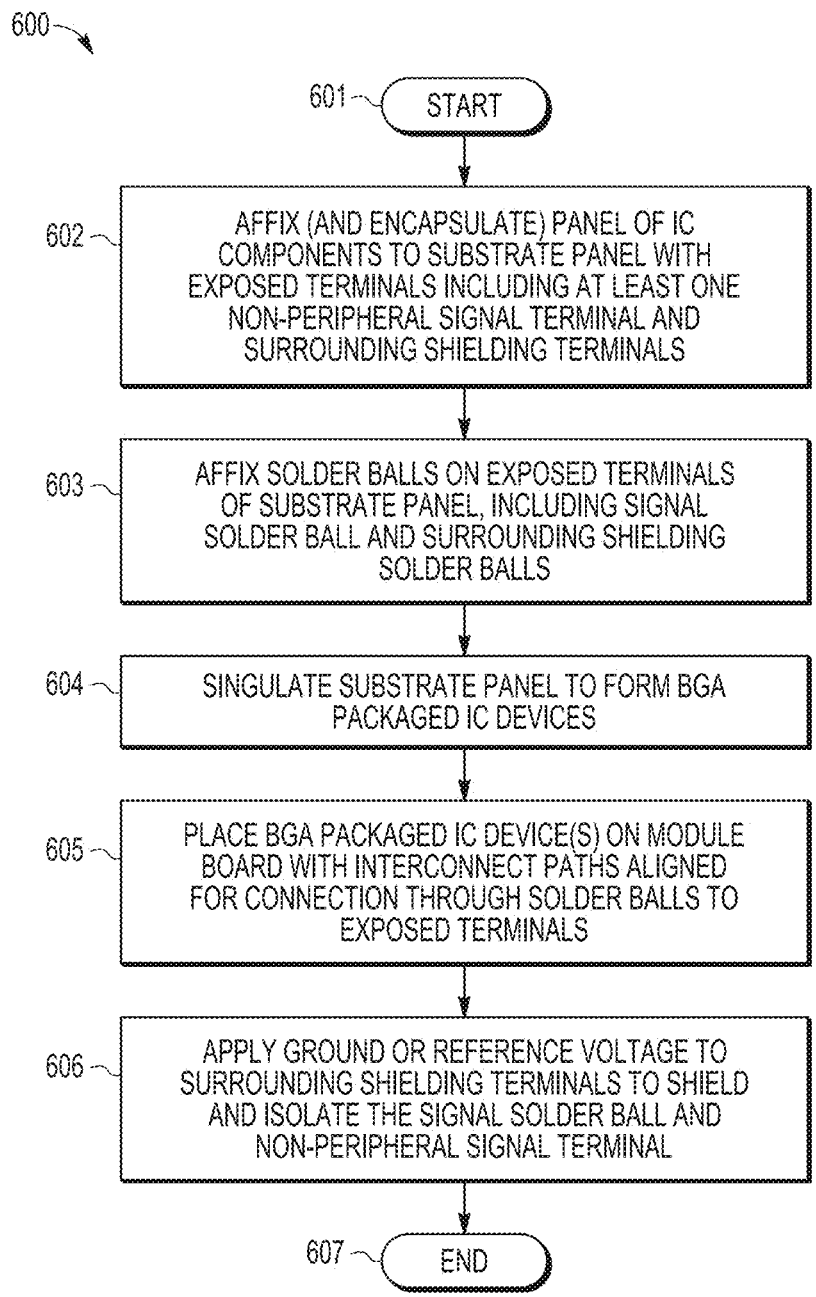
FIG. 6 illustrates a simplified flow chart sequence for designing and fabricating BGA packaged integrated circuit devices having signal solder balls surrounded by shielding solder ball conductors.

Turning now to FIG. 6, there is illustrated a simplified flow chart sequence 600 for designing and fabricating BGA packaged integrated circuit devices having signal solder balls surrounded by shielding solder ball conductors. The positioning and arrangement of shielding solder ball conductors to provide isolation for a single, surrounded solder ball may be used with "single ended" transmission lines where the signal solder ball (e.g., S) is surrounded by 8 additional ground solder balls (e.g., G), forming a 3×3 array of solder balls:

GGG
GSG
GGG.

In addition, the positioning and arrangement of shielding solder ball conductors may also provide high isolation for differential transmission lines where 2 signal solder balls (S) are surrounded by 10 additional ground solder balls (G), forming a 4×3 array of solder balls:

GGGG
GSSG
GGGG.

As will be appreciated, selected embodiments of the present disclosure may provide isolation for 3 or more signal solder balls by surrounding the 3 or more signal balls with a complete ring of ground solder balls. In addition, a single signal solder ball may be surrounded by a ring of 4 ground solder balls.

Once the method starts (601), a panel of integrated circuit components are affixed to a substrate panel, such as by using a pick-and-place-machine to place a plurality of circuit component chips (e.g., active or passive circuit components) onto a carrier substrate using an adhesive layer or other die attach mechanism (602). At the attachment face with the carrier substrate, the IC components may be attached and connected to a plurality of conductors, such as flip-chip bump conductors. If desired, the panel of IC components may be encapsulated by covering or encapsulating the circuit components with a suitable encapsulant material, such as an epoxy molding compound which is cured to form a mold compound body that covers the IC components, thereby forming an encapsulated panel of IC components. In the carrier substrate panel, conductive interconnect vias and signal trace lines are formed between the plurality of conductors and a plurality of conductor pads, terminating in exposed terminals on the opposite face of the carrier substrate to provide a conductive path for signals and voltages. By design, the exposed terminals include at least one non-peripheral signal terminal and a plurality of surrounding ground terminals arranged in an array around the signal terminal.

At 603, conductive interconnect structures are built on the opposite face of the carrier substrate to make electrical contact with exposed contact terminals of carrier substrate, such as by sequentially depositing, patterning, etching insulating layers and conductive layers (e.g., plated copper) to form fine pitched plated conductor lines. In addition or in the alternative, conductive ball connectors (e.g., solder balls) and/or surface mount devices are mounted or attached to the opposite face of the carrier substrate to make electrical contact with exposed contact terminals of the carrier substrate. When forming the conductive ball connectors as ball grid array (BGA) conductors, a layer of electrically conductive material (e.g., copper, conductive paste or solder, or conductive epoxy) may be applied to each conductor pad formed on the carrier substrate for attaching and electrically connecting a corresponding solder ball and contact pad. In general, any epoxy or curable material loaded with high conductive particles can be used. The affixed conductive ball connectors include a signal solder ball that is connected to the non-peripheral signal terminal, and also include a plurality of surrounding shielding solder balls connected to the surrounding shielding terminals (e.g., in a 2×2, 3×3 or 4×3 array).

At 604, the (encapsulate) panel of IC components and substrate panel may be singulated into individual BGA packaged IC devices, such as by using mechanical saws, lasers, or other appropriate means. The saw singulation process separates the substrate panel (and encapsulant packaging) along saw cut lines or scribe grids, leaving the conductive ball connectors (e.g., solder balls) intact.

At 605, each BGA packaged IC device, including attached conductive interconnect structures (e.g., BGA conductors), is mounted to a module or test board, such as a process carrier, panel, or other suitable substrate, using any desired attachment or adhesive mechanism. For example, the ball grid array conductors may be connected with aligned interconnect paths (e.g., conductor pads) formed in the module/test board using a layer of electrically conductive material (e.g., copper, conductive paste or solder, or conductive epoxy) to attach and electrically connect a corresponding solder ball and interconnect structure. In this way, the conductive interconnect structures connect the exposed terminals of the carrier substrate to the interconnect paths of the module/test board. At this point, any additional singulation of the module board panel is performed, and the individual BGA packaged IC devices may be placed in a tray and sent for inspection and testing.

At 606, the completed BGA packaged IC device is activated by applying signal and power through the interconnect paths in the module/test board for transmission across the conductive interconnect structures (e.g., BGA conductors) and interconnect paths in the carrier substrate to the packaged IC component(s). Having designed and aligned the exposed terminals, BGA conductors and interconnect paths to route an input or output signal through a first BGA signal conductor that is surrounded on all sides by a plurality of BGA shield conductors, the application of a reference voltage (e.g., ground) to the plurality of BGA shield conductors shields and isolates the signal solder ball and connected non-peripheral signal terminal. The process ends at 607.

By now it should be appreciated that there is provided herein a method of making packaged electronic devices. In the disclosed methodology and electronic device apparatus, a substrate is provided that includes a first plurality of conductive interconnect paths extending between first and second opposed surfaces of the substrate. In selected embodiments, the substrate includes a plurality of reference voltage terminal package landing pads and a plurality of signal line package landing pads formed on the second surface of the substrate for connection to the first plurality of interconnect paths and attachment to a ball grid array of conductors. In addition, the first plurality of conductive interconnect paths may include a conductive through hole structure affixed to each signal line package landing pad and extending from the first surface of the substrate and into the substrate, and may also include an array of shielding conductive through hole structures surrounding each conductive through hole structure in an isolation ring and extending from the first surface of the substrate and into the substrate. On the first surface of the substrate, an integrated circuit die is affixed for electrical connection to the plurality of conductive interconnect paths. For example, the integrated circuit die may be affixed with a plurality of flip-chip bump conductors. On the second surface of the substrate, a ball grid array of conductors is affixed for electrical connection to the plurality of conductive interconnect paths, where ball grid array includes a signal feed solder ball and an array of shielding ground solder balls surrounding the signal feed solder ball. The ball grid array of conductors may include a plurality of solder ball conductors or conductive pillars affixed to the second surface of the substrate. In selected embodiments, the array of shielding or grounded solder balls is attached as a 3×3 array of shielding solder balls surrounding the signal feed solder ball. In other embodiments, the array of shielding solder balls is attached as a 3×3 array of shielding solder balls surrounding the signal feed solder ball. The disclosed electronic device apparatus may also include a module board having a second plurality of conductive interconnect paths extending between first and second opposed surfaces of the module board, where the first surface of the module board is connected to the ball grid array to make electrical connection between the first and second plurality of conductive interconnect paths. In selected embodiments, the second plurality of conductive interconnect paths include a first signal interconnect path which connects the signal feed solder ball to a signal transmission line located on the first surface of the module board. In other embodiments, the second plurality of conductive interconnect paths includes a first signal interconnect path which connects the signal feed solder ball to a signal transmission line located on the second surface of the module board.

In another form, there is provided a grid array packaged device and method manufacturing and using same. As disclosed, the grid array packaged device includes an integrated circuit carrier substrate having a bottom interconnect surface on which is formed one or more first conductive signal contact pads surrounded by a first plurality of shielding contact pads formed in a ring around the one or more first conductive signal contact pads. In selected embodiments, the integrated circuit carrier substrate may include a conductive through hole structure affixed to each of the one or more first conductive signal contact pads and extending from the bottom interconnect surface and into the integrated circuit carrier substrate. In addition, the integrated circuit carrier substrate may include an array of shielding conductive through hole structures surrounding each conductive through hole structure in an isolation ring and extending from the bottom interconnect surface and into the integrated circuit carrier substrate. The grid array packaged device also includes a array of conductors, such as BGA, LGA, PGA C4 bump or flip chip conductors, including (1) one or more signal conductors affixed to the one or more first conductive signal contact pads, and (2) an array of shielding conductors surrounding the one or more signal conductors in an isolation ring and affixed to the first plurality of shielding contact pads. In selected embodiments, the one or more signal conductors may be a single signal feed solder ball connected to a single-ended signal transmission line, and the array of shielding conductors may be a 2×2 or 3×3 array of shielding solder balls surrounding the single signal feed solder ball. In other embodiments, the one or more signal conductors may be a pair of signal feed solder balls connected as differential signal transmission lines, and the array of shielding conductors may be a 4×3 array of shielding solder balls surrounding the pair of signal feed solder balls. In addition, the ball grid array packaged device includes an interconnect structure having a top interconnect surface, one or more second conductive signal contact pads formed on the top interconnect surface and affixed to the one or more signal conductors, and a second plurality of shielding contact pads formed on the top interconnect surface in a ring around the one or more second conductive signal contact pads and affixed to the array of shielding conductors. In selected embodiments, the interconnect structure may also include a plurality of conductive interconnect paths extending between top and bottom opposed surfaces of the interconnect structure, including at least a first signal interconnect path which connects at least one of the one or more second conductive signal contact pads to a signal transmission line located on the top or bottom surface of the interconnect structure. The interconnect structure may also be embodied as a module board having a plurality of conductive interconnect paths extending between top and bottom opposed surfaces of the module board for connection to the one or more second conductive signal contact pads and the second plurality of shielding contact pads. In the ball grid array packaged device, the first plurality of shielding contact pads, the array of shielding conductors, and the second plurality of shielding contact pads are positioned and aligned for electrical connection to a ground reference voltage.

In yet another form, there is provided a method for making and using an electronic device. In the disclosed methodology, an integrated circuit carrier substrate is provided that includes one or more conductive signal interconnect paths extending from a first surface of the integrated circuit carrier substrate, one or more conductive signal contact pads formed on the first surface of the integrated circuit carrier substrate and directly electrically connected to the one or more conductive signal interconnect paths, and a plurality of shielding contact pads formed in a ring on the first surface of the integrated circuit carrier substrate to surround the one or more conductive signal contact pads. In addition, a plurality of surface mount conductor structures are affixed to the one or more conductive signal contact pads and the plurality of shielding contact pads. In selected embodiments, the surface mount conductor structures include surface mount signal conductor structures affixed to the conductive signal contact pads, and an array of shielding surface mount conductor structures surrounding the surface mount signal conductor structures in an isolation ring and affixed to the plurality of shielding contact pads. By providing a ground reference voltage to the plurality of shielding contact pads and attached array of shielding surface mount conductor structures, the conductive signal contact pads and attached one or more surface mount signal conductor structures may be electrically isolated or shielded from other interfering signals in the electronic device. In addition, by providing a ground reference voltage to an array of shielding conductive through hole structures located in the integrated circuit carrier substrate to extend from the first surface of the integrated circuit carrier substrate and surround one or more conductive signal through hole structures that are directly electrically connected to the one or more conductive signal contact pads, the one or more conductive signal contact pads and attached one or more surface mount signal conductor structures are electrically isolated or shielded from other interfering signals in the electronic device.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified block diagrams and flow charts illustrating design and operational details of a BGA package with a shielding array of surrounding solder balls for isolating signal lines for radio frequency and millimeter wave products without including every device feature or aspect in order to avoid limiting or obscuring the present invention. Such descriptions and representations are used by those skilled in the art to describe and convey the substance of their work to others skilled in the art, and the omitted details which are well known are not considered necessary to teach one skilled in the art of how to make or use the present invention.

Although the described exemplary embodiments disclosed herein are directed to a method and apparatus in which a shielding array of surrounding conductors, such as BGA, LGA, PGA, C4 bump or flip chip conductors or solder balls, is designed and used to confine electromagnetic fields from signal conductor/solder balls and improve signal line isolation, the present invention is not necessarily limited to the example embodiments which illustrate inventive aspects of the present invention that are applicable to a wide variety of packaging processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the methodology of the present invention may be applied using materials other than expressly set forth herein. In addition, the process steps may be performed in an alternative order than what is presented. Also, the figures do not show all the details of connections between various elements of the package, since it will be appreciated the leads, vias, bonds, circuit traces, and other connection means can be used to effect any electrical connection. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. In addition, the term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. An electronic device comprising:
   a substrate comprising a first plurality of conductive interconnect paths extending between first and second opposed surfaces of the substrate;
   an integrated circuit die affixed to the first surface of the substrate for electrical connection to the plurality of conductive interconnect paths; and
   an array of conductors affixed to the second surface of the substrate for electrical connection to the plurality of conductive interconnect paths, said array comprising a signal feed conductor and an array of shielding conductors surrounding the signal feed conductor.

2. The electronic device of claim 1, where the first plurality of conductive interconnect paths in the substrate comprises:
   a conductive through hole structure connected to the signal feed conductor and extending from the second surface of the substrate and into the substrate; and
   an array of shielding conductive through hole structures surrounding each conductive through hole structure in an isolation ring and extending from the second surface of the substrate and into the substrate.

3. The electronic device of claim 2, where the array of shielding conductive through hole structures comprises a 3×3 or 4×3 array of micro-via structures positioned between the signal feed conductor and the array of shielding conductors to surround the conductive through hole structure.

4. The electronic device of claim 1, where the array of shielding conductors comprises a 3×3 array of shielding solder balls surrounding the signal feed conductor.

5. The electronic device of claim 1, where the array of shielding conductors comprises a 4×3 array of shielding solder balls surrounding the signal feed conductor.

6. The electronic device of claim 1, further comprising a module board comprising a second plurality of conductive interconnect paths extending between first and second opposed surfaces of the module board, where the first surface of the module board is connected to the array to make electrical connection between the first and second plurality of conductive interconnect paths.

7. The electronic device of claim 6, where the second plurality of conductive interconnect paths comprises a first signal interconnect path which connects the signal feed conductor to a signal transmission line located on the first surface of the module board.

8. The electronic device of claim 6, where the second plurality of conductive interconnect paths comprises a first signal interconnect path which connects the signal feed conductor to a signal transmission line located on the second surface of the module board.

9. The electronic device of claim 1, where the array of conductors comprises a plurality of conductors or conductive pillars affixed to the second surface of the substrate.

10. A packaged device, comprising:
an integrated circuit carrier substrate comprising a bottom interconnect surface on which is formed one or more first conductive signal contact pads surrounded by a first plurality of shielding contact pads formed in a ring around the one or more first conductive signal contact pads;
an array of conductors comprising one or more signal conductors affixed to the one or more first conductive signal contact pads, and an array of shielding conductors surrounding the one or more signal conductors in an isolation ring and affixed to the first plurality of shielding contact pads; and
an interconnect structure comprising a top interconnect surface, one or more second conductive signal contact pads formed on the top interconnect surface and affixed to the one or more signal conductors, and a second plurality of shielding contact pads formed on the top interconnect surface in a ring around the one or more second conductive signal contact pads and affixed to the array of shielding conductors.

11. The packaged device of claim 10, wherein the one or more signal conductors comprises a single signal feed solder ball connected to a single-ended signal transmission line, and wherein the array of shielding conductors comprises a 2×2 or 3×3 array of shielding solder balls surrounding the single signal feed solder ball.

12. The packaged device of claim 10, wherein the one or more signal conductors comprises a pair of signal feed solder balls connected as differential signal transmission lines, and wherein the array of shielding conductors comprises a 4×3 array of shielding solder balls surrounding the pair of signal feed solder balls.

13. The packaged device of claim 10, wherein the first plurality of shielding contact pads, the array of shielding conductors, and the second plurality of shielding contact pads are positioned and aligned for electrical connection to a ground reference voltage.

14. The packaged device of claim 10, where the interconnect structure further comprises a plurality of conductive interconnect paths extending between top and bottom opposed surfaces of the interconnect structure, the plurality of conductive interconnect paths comprising at least a first signal interconnect path which connects at least one of the one or more second conductive signal contact pads to a signal transmission line located on the top surface of the interconnect structure.

15. The packaged device of claim 10, where the interconnect structure further comprises a plurality of conductive interconnect paths extending between top and bottom opposed surfaces of the interconnect structure, the plurality of conductive interconnect paths comprising at least a first signal interconnect path which connects at least one of the one or more second conductive signal contact pads to a signal transmission line located on the bottom surface of the interconnect structure.

16. The packaged device of claim 10, where the interconnect structure comprises a module board comprising a plurality of conductive interconnect paths extending between top and bottom opposed surfaces of the module board for connection to the one or more second conductive signal contact pads and the second plurality of shielding contact pads.

17. The packaged device of claim 10, where the integrated circuit carrier substrate further comprises:
a conductive through hole structure affixed to each of the one or more first conductive signal contact pads and extending from the bottom interconnect surface and into the integrated circuit carrier substrate; and
an array of shielding conductive through hole structures surrounding each conductive through hole structure in an isolation ring and extending from the bottom interconnect surface and into the integrated circuit carrier substrate.

18. A method, comprising:
providing an integrated circuit carrier substrate comprising:
one or more conductive signal interconnect paths extending from a first surface of the integrated circuit carrier substrate,
one or more conductive signal contact pads formed on the first surface of the integrated circuit carrier substrate and directly electrically connected to the one or more conductive signal interconnect paths, and
a plurality of shielding contact pads formed in a ring on the first surface of the integrated circuit carrier substrate to surround the one or more conductive signal contact pads; and
affixing a plurality of surface mount conductor structures to the one or more conductive signal contact pads and the plurality of shielding contact pads comprising one or more surface mount signal conductor structures affixed to the one or more conductive signal contact pads, and an array of shielding surface mount conductor structures surrounding the one or more surface mount signal conductor structures in an isolation ring and affixed to the plurality of shielding contact pads.

19. The method of claim 18, further comprising providing a ground reference voltage to the plurality of shielding contact pads and attached array of shielding surface mount conductor structures to electrically isolate the one or more conductive signal contact pads and attached one or more surface mount signal conductor structures.

20. The method of claim 19, further comprising providing a ground reference voltage to an array of shielding conductive through hole structures located in the integrated circuit carrier substrate to extend from the first surface of the integrated circuit carrier substrate and surround one or more conductive signal through hole structures that are directly electrically connected to the one or more conductive signal contact pads, thereby electrically isolating the one or more conductive signal contact pads and attached one or more surface mount signal conductor structures.

* * * * *